United States Patent
Iwai

(10) Patent No.: US 9,781,884 B1
(45) Date of Patent: Oct. 10, 2017

(54) SOIL CULTIVATION SYSTEM EQUIPPED WITH SOLAR PANEL

(71) Applicant: Farm Land Co., Ltd., Maebashi-shi, Gunma (JP)

(72) Inventor: Masayuki Iwai, Maebashi (JP)

(73) Assignee: Farm Land Co., Ltd., Maebashi-shi, Gunma (JP)

( * ) Notice: Subject to any disclaimer, the term of this patent is extended or adjusted under 35 U.S.C. 154(b) by 0 days.

(21) Appl. No.: 15/399,737

(22) Filed: Jan. 6, 2017

Related U.S. Application Data

(63) Continuation of application No. PCT/JP2016/070950, filed on Jul. 15, 2016.

(51) Int. Cl.
*A01G 9/00* (2006.01)
*A01G 9/24* (2006.01)
(Continued)

(52) U.S. Cl.
CPC .............. *A01G 9/247* (2013.01); *A01C 21/00* (2013.01); *A01G 1/001* (2013.01); *A01G 9/14* (2013.01);
(Continued)

(58) Field of Classification Search
CPC .......... A01G 31/02; A01G 7/045; A01G 9/02; A01G 9/243; H02S 20/23
See application file for complete search history.

(56) References Cited

U.S. PATENT DOCUMENTS

| 2010/0236164 A1* | 9/2010 | Chuang | A01G 9/243 52/173.3 |
| 2011/0005128 A1* | 1/2011 | Chuang | A01G 9/243 47/17 |

(Continued)

FOREIGN PATENT DOCUMENTS

| IT | 2294910 A1 * | 3/2011 | ............. A01G 9/243 |
| JP | S63-036719 A | 2/1988 | |

(Continued)

OTHER PUBLICATIONS

International Search Report for PCT/JP2016/070950 dated Sep. 20, 2016.
PCT written opinion dated Sep. 20, 2016.

*Primary Examiner* — Kristen C Hayes
(74) *Attorney, Agent, or Firm* — Yokot & Co., USA; Toshiyuki Yokoi

(57) ABSTRACT

In the soil cultivation system equipped with a solar panel, the space between ridges of a plurality of frame units supporting the solar panels is coupled with a roof member, furthermore, the perimeter surface thereof is integrally covered with a cover unit. In this way, a cultivation house in which the frame units are used as support columns is established. Then, in the solar panels, light transmitting regions are provided, a transmissive member is used as the roof member and thus agricultural plants are cultivated by light passing through the light transmitting regions and the roof member. Furthermore, the cultivation of the agricultural plants is performed in cultivation tanks in which a soil is put, (Continued)

and an appropriate cultivation nutrient solution is supplied through a supply means. In this way, the cultivation environment of the agricultural plants is managed, and thus the agricultural plants can be efficiently cultivated while the burden of an operator is reduced.

4 Claims, 5 Drawing Sheets

(51) Int. Cl.

| | |
|---|---|
| *A01G 1/00* | (2006.01) |
| *A01G 9/20* | (2006.01) |
| *A01G 9/14* | (2006.01) |
| *A01C 21/00* | (2006.01) |
| *A01G 27/00* | (2006.01) |
| *H02S 99/00* | (2014.01) |
| *H02S 20/23* | (2014.01) |
| *F21S 11/00* | (2006.01) |
| *F21S 8/00* | (2006.01) |

(52) U.S. Cl.
CPC .............. *A01G 9/20* (2013.01); *A01G 27/00* (2013.01); *F21S 8/03* (2013.01); *F21S 11/007* (2013.01); *H02S 20/23* (2014.12); *H02S 99/00* (2013.01)

(56) References Cited

U.S. PATENT DOCUMENTS

| | | | |
|---|---|---|---|
| 2016/0081282 A1* | 3/2016 | Salomon | .................. E04B 7/12 136/248 |
| 2016/0165822 A1 | 6/2016 | Iwai | |
| 2016/0262323 A1 | 9/2016 | Iwai | |

FOREIGN PATENT DOCUMENTS

| | | |
|---|---|---|
| JP | H06-225647 A | 8/1994 |
| JP | 2009-261337 A | 11/2009 |
| JP | 2014-018082 A | 2/2014 |
| JP | 2016-010353 A | 1/2016 |
| JP | 2016-059280 A | 4/2016 |
| JP | 2016-106554 A | 6/2016 |

\* cited by examiner

US 9,781,884 B1

SOIL CULTIVATION SYSTEM EQUIPPED WITH SOLAR PANEL

CROSS-REFERENCES TO RELATED APPLICATIONS

This Application claims the benefit of priority and is a Continuation application of the prior International Patent Application No. PCT/JP2016/070950, with an international filing date of Jul. 15, 2016, which designated the United States, the entire disclosures of all applications are expressly incorporated by reference in their entirety herein.

BACKGROUND OF THE INVENTION

1. Field of the Invention

The present invention relates to a soil cultivation system equipped with a solar panel in which agricultural plants are cultivated under the solar panel.

2. Description of Related Art

In recent years, a growing interest in renewable energy has led to the widespread use of solar panels, which receives sunlight and generates power, to ordinary homes and ordinary businesses. Mega solar power plants wherein solar panels are disposed in a relatively large space are also built in many places. However, when a solar panel is placed on the ground, in many cases, the area under the solar panel is not utilized. Taking such a problem into consideration, an invention described in the following [Patent Literature 1] discloses a technique wherein an agricultural plant is cultivated on the ground under a solar panel.

[Patent Literature 1] Japanese Published Unexamined Patent Application No. 2014-018082

BRIEF SUMMARY OF THE INVENTION

However, there is a problem that in the invention disclosed in [Patent Literature 1], the amount of light on agricultural plants is insufficient, and thus agricultural plants which can be cultivated is limited. Moreover, for example, since rain is interrupted by the solar panel, watering is needed.

The present invention has been made in view of such a situation, and an object thereof is to provide a soil cultivation system equipped with a solar panel in which the solar panel is used as a roof and the frame of the solar panel is used as a column so as to establish a cultivation house and so that it is possible to manage the cultivation environment of agricultural plants under the solar panel.

(1) The present invention solves the above problems by providing a soil cultivation system 80 equipped with a solar panel including: a solar panel 50 which receives light to generate power; and a frame unit 20 which holds the solar panel 50 at a specific angle, where the solar panel 50 includes a panel board portion 54 which has light transmissivity, a plurality of solar cells 52 which are arranged with a specific gap in the panel board portion 54 and a light transmitting region A which is formed by the gap of the solar cells 52, the frame unit 20 is long in a horizontal direction, and a plurality of the frame units 20 are arranged in a vertical direction, a space between ridges of the frame units 20 is coupled with a light transmissive roof member 40, and a plurality of the frame units 20 and sides of the space between ridges are integrally covered with a cover unit 24 which has light transmissivity and which is freely opened and closed, and the soil cultivation system 80 equipped with a solar panel further includes: cultivation tanks 30 which are installed under the solar panels 50 and in the space between ridges, in which at least an upper surface is open and in which a specific soil is put; a nutrient solution tank 14 in which a cultivation nutrient solution containing a specific fertilizer component is stored; and a supply means 12 which supplies the cultivation nutrient solution to the cultivation tanks 30.

(2) The present invention solves the above problems by providing the soil cultivation system 80 equipped with a solar panel according to the above (1), wherein the roof member 40 is a matte light diffusion plate or a matte light diffusion film in which a plurality of fine projections and recesses are formed in a surface.

(3) The present invention solves the above problems by providing the soil cultivation system 80 equipped with a solar panel according to the above (1) or (2), wherein the cultivation tank 30 is a cultivation bag 30a.

(4) The present invention solves the above problems by providing the soil cultivation system 80 equipped with a solar panel according to the above (1) or (2), wherein the cultivation tank 30 whose bottom surface and upper surface are open is formed by surrounding a specific area with a cultivation wall 30b.

In the soil cultivation system equipped with a solar panel according to the present invention, frame units are used as support columns to establish a cultivation house. Furthermore, the cultivation of agricultural plants is performed in cultivation tanks in which an appropriate soil is put, and to which an appropriate cultivation nutrient solution is supplied, with the result that the cultivation environment of the agricultural plants can be managed. In this way, the agricultural plants can be efficiently cultivated while the burden of an operator is reduced. Then, a farmer can obtain not only income from the selling of the cultivated agricultural plants but also income from the sales of electric power generated by the solar panels and the like.

DETAILED DESCRIPTION OF THE INVENTION

Figure 1:
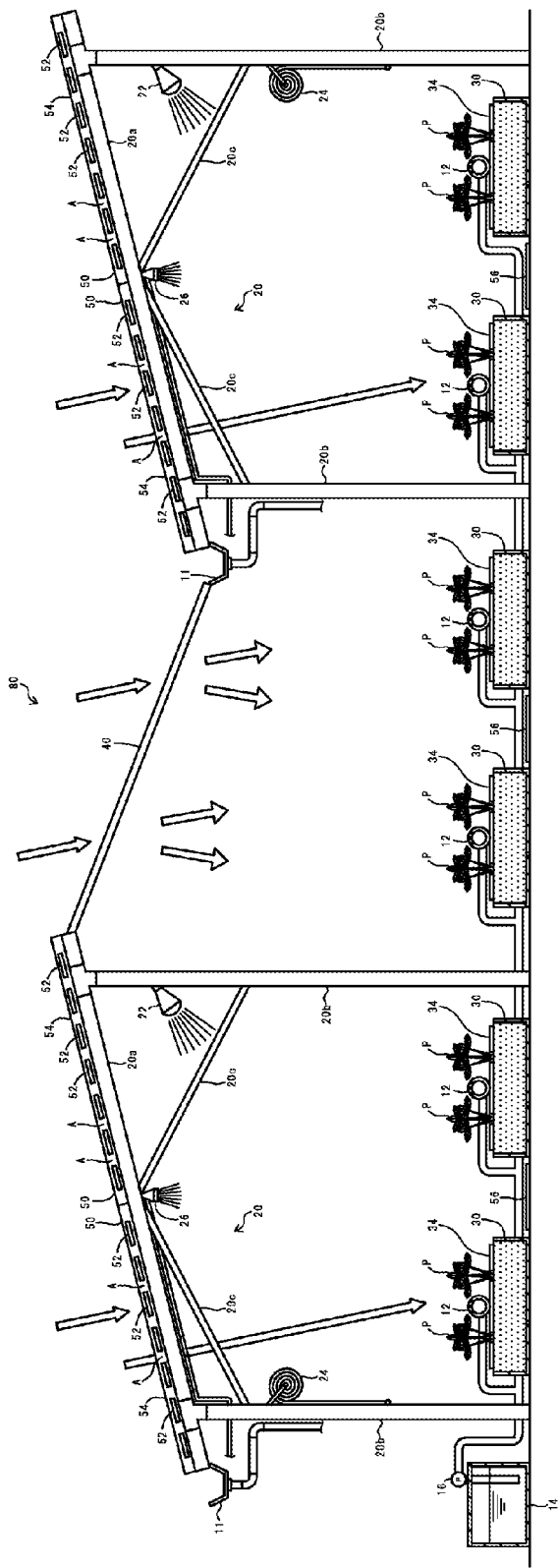
FIG. 1 is a view for illustrating a soil cultivation system equipped with a solar panel according to the present invention.

An embodiment of a soil cultivation system 80 equipped with a solar panel according to the present invention will be described with reference to drawings. FIG. 1 is a view for illustrating the entire soil cultivation system 80 equipped with a solar panel according to the present invention. The soil cultivation system 80 equipped with a solar panel according to the present invention includes: solar panels 50 which receive light to generate power; frame units 20 which have a transverse frame 20a and a vertical frame 20b so as to hold the solar panels 50 at a specific angle; a light transmissive roof member 40 which is provided in a space between ridges of a plurality of the frame units 20; a cover unit 24 which integrally covers a plurality of the frame units 20 and sides of the space between ridges; cultivation tanks 30 which are installed under the solar panels 50 and in the space between ridges and in which at least the upper surface thereof is open; a nutrient solution tank 14 in which a cultivation nutrient solution containing specific fertilizer components is stored; and a supply means 12 which supplies the cultivation nutrient solution to the cultivation tanks 30. It is to be noted that a gap between the solar panels 50 in the frame unit 20 is closed, and thus rainwater and the like are prevented from infiltrating into the frame unit 20 from between the solar panels 50.

Figure 2:
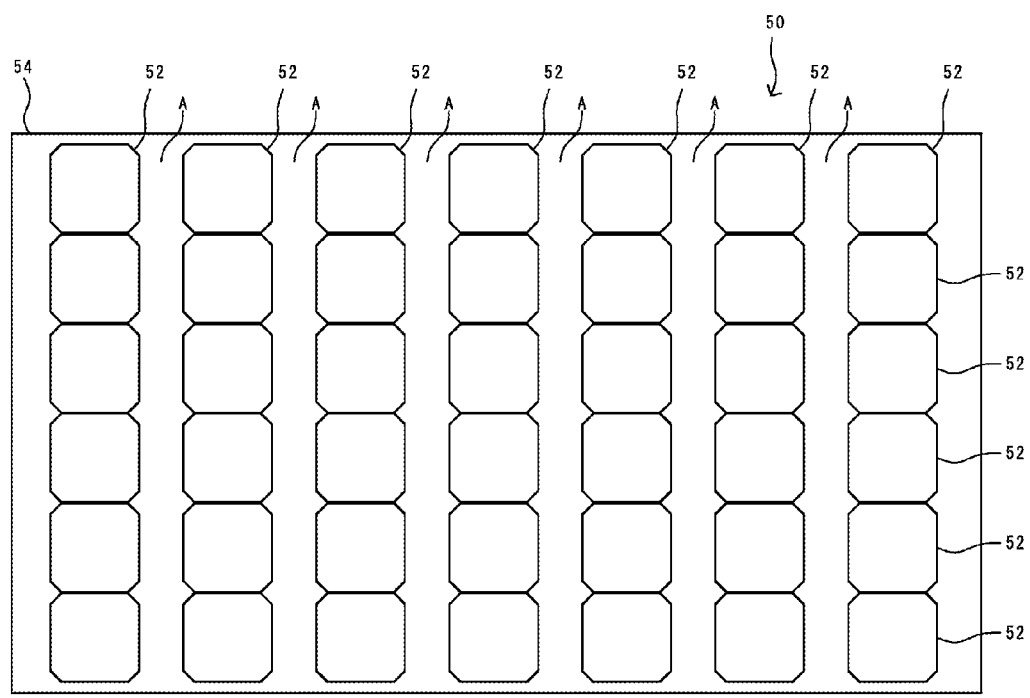
FIG. 2 is a view for illustrating the solar panels of the soil cultivation system equipped with a solar panel according to the present invention.

As shown in FIG. 2, the solar panel 50 includes a panel board portion 54 such as glass which has light transmissivity and known solar cells 52 which are provided in the panel board portion 54 and in which a power generation region is provided on a front surface side. A plurality of the solar cells 52 are arranged with a specific gap in the panel board portion 54, and the gap between the solar cells 52 is a light transmitting region A in the solar panel 50. It is to be noted that although FIG. 2 illustrates an example where 6 solar cells 52 are disposed adjacent to each other in the vertical direction of the figure, and 7 rows are arranged with a gap in the horizontal direction of the figure, it is to be noted that the arrangement of the solar cells 52 is not particularly limited to such an example and may be any other arrangement. However, the area of the light transmitting region A is preferably set to approximately 20 to 30% of the solar panel 50 from a balance between the amount of light acquired and the amount of power generated, and for example, in a solar panel 50 having dimensions capable of an arrangement of 6×10 rows in the entire surface, as shown in FIG. 2, an arrangement of 6×7 rows or 6×8 rows is preferably adopted. The light transmitting regions A of the solar cells 52 may be provided in the horizontal direction or may be provided both in the vertical and horizontal directions. However, preferably, in terms of wiring of the solar panels 50, as shown in FIG. 2, the solar cells 52 are disposed adjacent to each other in the vertical direction, and are arranged with a gap in the horizontal direction.

Figure 3:
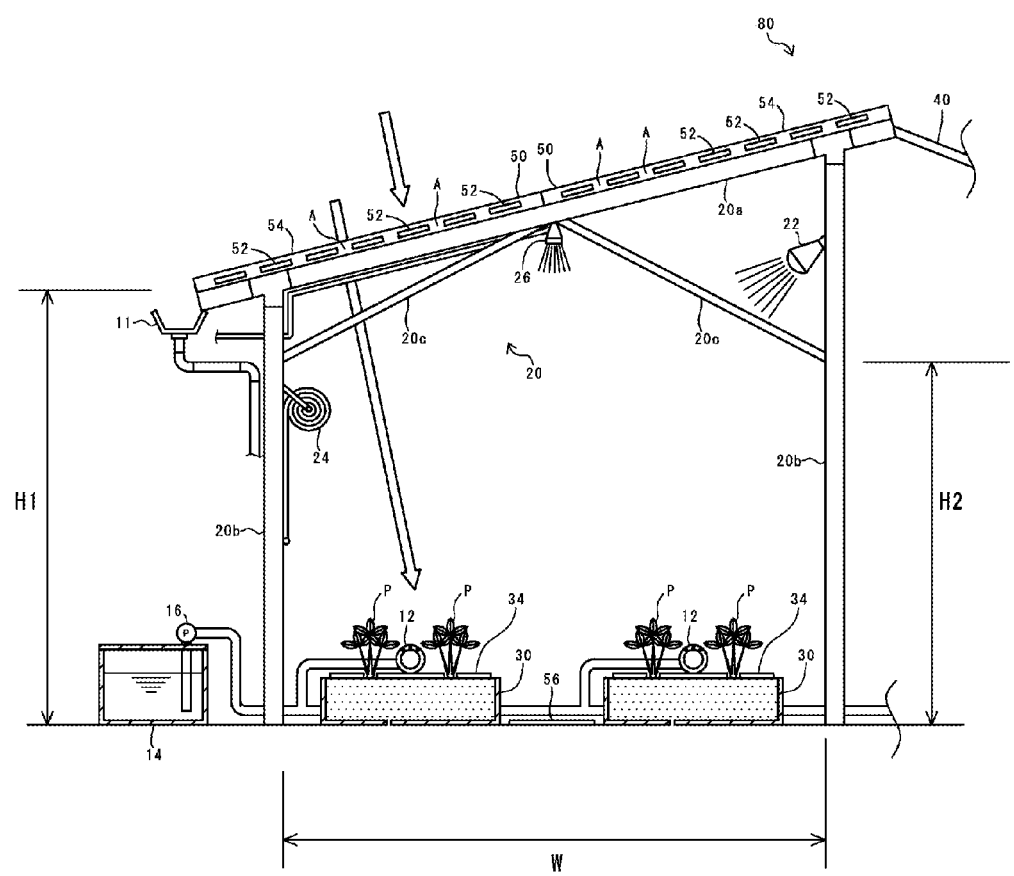
FIG. 3 is a view for illustrating the dimensions of the soil cultivation system equipped with a solar panel according to the present invention.

The transverse frame 20a configured to hold the solar panel 50 is generally faced south and is fixed at an angle whereby the solar panel 50 is irradiated most efficiently with sunlight. Preferably, as shown in FIG. 3, the length of the vertical frame 20b is set such that the height H1 of the lowest point of the interior of the frame unit 20 is placed at a relatively high position of approximately 200 to 300 cm (preferably, approximately 250 cm) from the ground surface. An interval between the front and back vertical frames 20b, that is, the depth W of the frame unit 20 is preferably set to approximately 200 to 300 cm. Both in the horizontal direction (the longitudinal direction) and in the forward and backward direction (the depth direction) of the frame unit 20, reinforcement frames 20c which obliquely connect the vertical frame 20b and the transverse frame 20a and which function as a bracing are preferably provided. In particular, in the reinforcement frame 20c in the forward and backward direction, the height H2 of the lowest point thereof is preferably placed at a position 150 cm higher than the ground surface.

It is to be noted that the height H1 from the ground surface is provided so as to be large, and thus sunlight passing through the light transmitting regions A spreads such as by diffraction, with the result that the sunlight can be irradiated to agricultural plants P in a wider range. It is to be noted that the surfaces of the transverse frame 20a, the vertical frame 20b and the reinforcement frame 20c are preferably coated with white paint or the like having light reflectivity, or the surfaces of the transverse frame 20a, the vertical frame 20b and the reinforcement frame 20c to be used preferably have metallic luster. Furthermore, a rain gutter 11 is preferably placed at the transverse frame 20a, so as to guide rainwater or the like flowing on the solar panel 50 toward a specific catch drain or the like. With such a structure, rainwater flowing on the solar panel 50 does not drip onto the ground surface, and therefore mud splattering or the like caused by such dripping can be prevented.

It is to be noted that the frame unit 20 is set long in the horizontal direction (the longitudinal direction of the solar panel 50), furthermore, a plurality of frame units 20 are installed so as to be aligned in the vertical direction (the depth direction). As described previously, the light transmissive roof member 40 is provided in the space between ridges of a plurality of the frame units 20, they are coupled to each other and thus the agricultural plants P can be cultivated even in the space between ridges. Furthermore, a plurality of the frame units 20 and sides of the space between ridges facing the perimeter are integrally covered with the cover unit 24 which has light transmissivity and which is freely opened and closed. In this way, the soil cultivation system 80 equipped with a solar panel functions as one cultivation house in which the frame units 20 are used as support columns. A windable and transparent sheet made of synthetic resin is particularly preferably used as the cover unit 24. However, the cover unit 24 is not limited to such a sheet, and a glass plate, a door or the like which can be opened and closed may be used. By suitably opening or closing the cover unit 24 depending on the weather, the temperature or the like, a side face of the soil cultivation system 80 equipped with a solar panel is put into an opened state, a closed state or a half-opened state. Thus, infiltration of rainwater into the soil cultivation system 80 equipped with a solar panel can be prevented by closing the cover unit 24 in rainy weather, for example. Moreover, damage by strong winds can be prevented. Moreover, the temperature in the soil cultivation system 80 equipped with a solar panel can be adjusted by putting the cover unit 24 into an opened state, a closed state or a half-opened state depending on the outdoor temperature. Thus, the growth environment of the agricultural plants P in the soil cultivation system 80 equipped with a solar panel can be managed to a certain extent. Moreover, the working environment of the operator can be improved.

Although as the roof member 40 connecting the space between ridges, a transparent member may be used, a light diffusion plate or a light diffusion film is particularly preferably used such that light incident on the roof member 40 is diffused and transmitted. As the light diffusion plate or the light diffusion film used here, a matte light diffusion plate or a matte light diffusion film in which fine projections and recesses are formed in the surface is particularly preferably used.

Figure 4A:
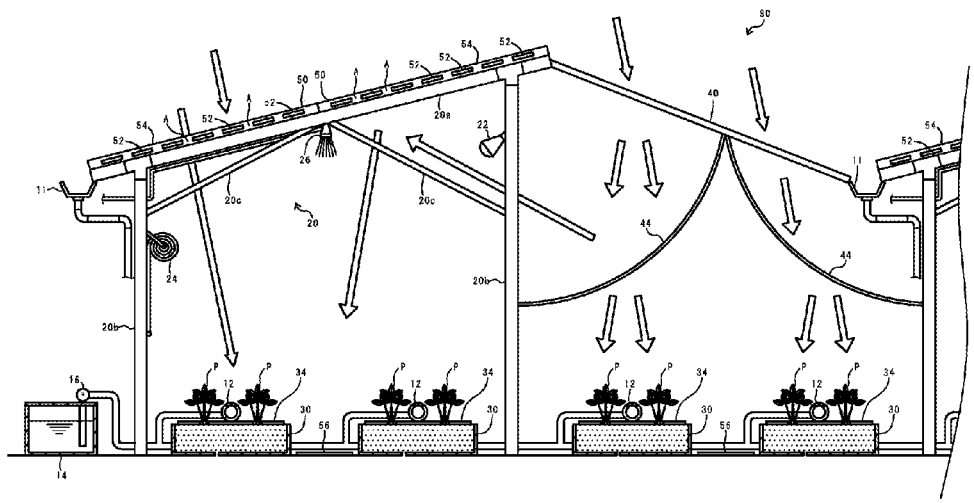
FIGS. 4A and 4B are views for illustrating the soil cultivation system equipped with a solar panel according to the present invention which includes a light diffusion sheet.
Figure 4B:
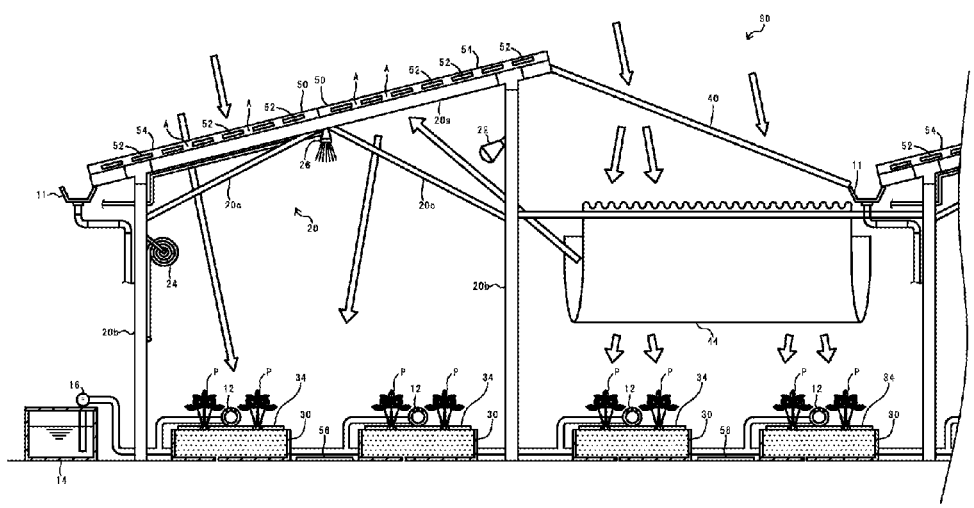

As shown in FIGS. 4A and 4B, under the roof member 40, a light diffusion sheet 44 which partially reflects light and partially transmits light to the side of the cultivation tanks 30 may be provided. As the light diffusion sheet 44, a white-based mesh sheet is particularly preferably used. With such a structure, sunlight is appropriately irradiated even to the agricultural plants P under the light diffusion sheet 44, and moreover, variations in the intensity of light within the soil cultivation system 80 equipped with a solar panel can be averaged by a light diffusion effect with the light diffusion sheet 44. It is to be noted that the roof member 40 and the light diffusion sheet 44 also have the effect of reducing the intense sunshine of summer. Furthermore, the light reflected by the light diffusion sheet 44 is reflected off the back surface of the solar panel 50 and the like and is used for cultivating the agricultural plants P.

Here, when the diffusion sheet 44 is assumed to be a light diffusion plate, although any fixing member such as a holding leg or a frame is needed, the light diffusion sheet 44 which is lightweight and flexible is hung with a hook or the like so that it can be easily installed in the soil cultivation system 80 equipped with a solar panel. When a hard light diffusion plate is used, it needs to be installed at a high place so as not to interfere with agricultural work or needs to be removed each time. However, a flexible light diffusion sheet 44 is used, and thus even when the light diffusion sheet 44 is installed at a low place, the operator can perform agricultural work without hitting their head with the light diffusion sheet 44. The light diffusion plate cannot be easily fitted and removed, on the other hand, the light diffusion sheet 44 can be easily opened and closed such as by being bundled, and it is possible to easily adjust the area and angle thereof according to the work, the amount of sunshine or the like.

Furthermore, a sprinkler 26 such as a sprinkler or a mist device configured to spray water on the agricultural plants P may be provided at the transverse frame 20*a*. In particular, when the mist device is provided, since it is possible to lower the temperature of the interior of the frame unit 20 by vaporization heat, it is also possible to simultaneously improve the working environment. It is to be noted that a water supply pipe to the sprinkler 26 may be placed along the transverse frame 20*a*, or may be placed through the transverse frame 20*a*.

In a section of the frame unit 20 inevitably having an insufficient received light quantity, it is to be noted that an auxiliary lamp 22 may be placed over the section as needed, so that the auxiliary lamp 22 compensates for shortage of light quantity. It is to be noted that a well-known lighting lamp such as an LED lamp or a fluorescent lamp can be used as the auxiliary lamp 22. Moreover, agricultural plants P to be cultivated may be varied depending on the received light quantity in the frame unit 20. With such a structure, an appropriate agricultural plant P can be selected and cultivated depending on the received light quantity of the area, and therefore efficient cultivation of the agricultural plant P can be achieved.

The soil cultivation system 80 equipped with a solar panel according to the present invention further includes: the cultivation tanks 30 which are installed on the ground surface, in which at least the upper surface thereof is open and in which a specific soil is put; the nutrient solution tank 14 in which the cultivation nutrient solution containing appropriate fertilizer components is stored; the supply means 12 which supplies the cultivation nutrient solution into the cultivation tanks 30; and a solution feed pump 16 which feeds the cultivation nutrient solution to the supply means 12.

Figure 5A:
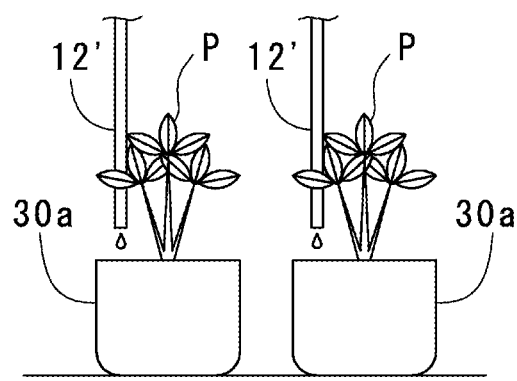
FIGS. 5A and 5B are views for illustrating an example of cultivation tanks and a supply means of the soil cultivation system equipped with a solar panel according to the present invention.
Figure 5B:
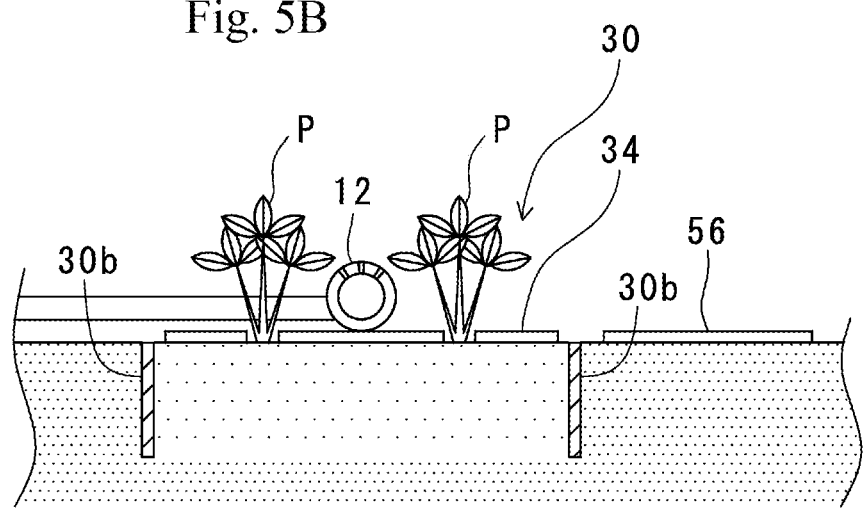

As the cultivation tank 30, a cultivation box as shown in FIG. 1 in which the bottom surface and the side surfaces thereof are closed and in which water removal holes are provided in the bottom surface, or a cultivation bag 30*a* shown in FIG. 5A can be used. As shown in FIG. 5B, a specific area is surrounded by a cultivation wall 30*b*, and this may be used as the cultivation tank 30 with the bottom surface and the upper surface open. In this case, the cultivation wall 30*b* may be provided on the ground or may be embedded in semi-underground or underground. As the soil which is put into the cultivation tank 30, soil which is appropriate for the agricultural plants P is basically selected.

As the supply means 12, a water spray pipe which is arranged along the cultivation tanks 30 as shown in FIG. 1, a water spray tube 12' which drops the cultivation nutrient solution on specific areas in the cultivation tanks 30 or the like can be used.

The opening portion of the upper surface of the cultivation tank 30 is preferably covered with a sheet-shaped member 34 in terms of weed-proofing, moisture retention, heat retention and the like. As the sheet-shaped member 34, a known agricultural multi-sheet of black, gray or the like which has light reflectivity to some degree, a sheet which is coated with a metallic thin film such as aluminum or the like can be used. A path between the cultivation tanks 30 is also preferably covered with a sheet-shaped member 56 in terms of weed-proofing and the like. As the sheet-shaped member 56, a weed-proof sheet of silver or the like which has light reflectivity to some degree and which has a specific strength is preferably used. It is to be noted that when as the sheet-shaped members 34 and 56, the member which has light reflectivity as described above is used, light reflected off the sheet-shaped members 34 and 56 is reflected off the frame units 20, the back surfaces of the solar panels 50, the light diffusion sheet 44 and the like and is utilized for the cultivation of the agricultural plants P.

An operation of the soil cultivation system 80 equipped with a solar panel according to the present invention will next be described. In the figures, white-solid arrows indicate the direction of the travel of light. First, when sunlight is irradiated to the solar panels 50, the power generation regions in the solar cells 52 generate and output power. The power output is fed through a power feed system (not shown) to a power selling unit, a storage battery, power demand or the like. Sunlight irradiated to the light transmitting regions A in the solar panels 50 and sunlight irradiated to the roof member 40 are captured into the frame units 20 and is used for the cultivation of the agricultural plants P. Here, the sunlight irradiated to the roof member 40 is appropriately diffused into the soil cultivation system 80 equipped with a solar panel.

In the nutrient solution tank 14, a specific amount of cultivation nutrient solution containing an amount of fertilizer components suitable for the cultivation of the agricultural plants P is stored. Then, the solution feed pump 16 is operated, for example, at given time intervals or under previously set conditions, and thus the cultivation nutrient solution within the nutrient solution tank 14 is fed to the supply means 12. In this way, an appropriate amount of cultivation nutrient solution is supplied from the supply means 12 into the cultivation tanks 30, and thus the agricultural plants P are cultivated.

As described above, in the soil cultivation system 80 equipped with a solar panel according to the present invention, the space between ridges of a plurality of frame units 20 supporting the solar panels 50 is coupled with the roof member 40, furthermore, the perimeter surface thereof is integrally covered with the cover unit 24. In this way, one cultivation house in which the frame units 20 are used as support columns is established. Then, in the solar panels 50, the light transmitting regions A are provided, the transmissive member is used as the roof member 40 and thus the agricultural plants P are cultivated by light passing through the light transmitting regions A and the roof member 40. Furthermore, the cultivation of the agricultural plants P is performed in the cultivation tanks 30 in which the appropriate soil is put, and the appropriate cultivation nutrient solution is supplied to the cultivation tanks 30 through the supply means 12. In this way, the cultivation environment of the agricultural plants P is managed, and thus the agricultural plants can be efficiently cultivated while the burden of the operator is reduced.

In addition, the farmer can obtain income from sales of electric power generated by the solar panel 50 or the like in addition to income from sales of the agricultural plants P cultivated. Thus, the income of the farmer can be increased.

The shapes, the configurations, the dimensions and the like of the soil cultivation system 80 equipped with a solar panel described in the present embodiment are examples, and the present invention can be varied without departing from the spirit of the present invention and can be practiced.

Note that, this invention is not limited to the above-mentioned embodiments.

Although it is to those skilled in the art, the following are disclosed as the one embodiment of this invention.

Mutually substitutable members, configurations, etc. disclosed in the embodiment can be used with their combination altered appropriately.

Although not disclosed in the embodiment, members, configurations, etc. that belong to the known technology and can be substituted with the members, the configurations, etc. disclosed in the embodiment can be appropriately substituted or are used by altering their combination.

Although not disclosed in the embodiment, members, configurations, etc. that those skilled in the art can consider as substitutions of the members, the configurations, etc. disclosed in the embodiment are substituted with the above mentioned appropriately or are used by altering its combination.

While the invention has been particularly shown and described with respect to preferred embodiments thereof, it should be understood by those skilled in the art that the foregoing and other changes in form and detail may be made therein without departing from the sprit and scope of the invention as defined in the appended claims.

EXPLANATION OF THE REFERENCES 12 supply means
14 nutrient solution tank
20 frame unit
24 cover unit
30 cultivation tank
30a cultivation bag
40 roof member
50 solar panel
52 solar cell
54 panel board portion
80 soil cultivation system equipped with a solar panel
A light transmitting region

What is claimed is:

1. A soil cultivation system equipped with a solar panel comprising:
   a solar panel which receives light to generate power; and
   a frame unit which holds the solar panel at a specific angle,
   wherein the solar panel includes a panel board portion which has light transmissivity, a plurality of solar cells which are arranged with a specific gap in the panel board portion and a light transmitting region which is formed by the gap of the solar cells,
   the frame unit is long in a horizontal direction, and a plurality of the frame units are arranged in a vertical direction,
   a space between ridges of the frame units is coupled with a light transmissive roof member, and a plurality of the frame units and sides of the space between ridges are integrally covered with a cover unit which has light transmissivity and which is freely opened and closed and
   the soil cultivation system equipped with a solar panel further includes: cultivation tanks which are installed under the solar panels and in the space between ridges, in which at least an upper surface is open and in which a specific soil is put; a nutrient solution tank in which a cultivation nutrient solution containing a specific fertilizer component is stored; and a supply means which supplies the cultivation nutrient solution to the cultivation tanks.

2. The soil cultivation system equipped with a solar panel according to claim 1,
   wherein the roof member is a matte light diffusion plate or a matte light diffusion film in which a plurality of fine projections and recesses are formed in a surface.

3. The soil cultivation system equipped with a solar panel according to claim 1,
   wherein the cultivation tank is a cultivation bag.

4. The soil cultivation system equipped with a solar panel according to claim 1,
   wherein the cultivation tank whose bottom surface and upper surface are open is formed by surrounding a specific area with a cultivation wall.

* * * * *